US012596154B2

(12) United States Patent
Ayad

(10) Patent No.: US 12,596,154 B2
(45) Date of Patent: Apr. 7, 2026

(54) BATTERY SYSTEM AND METHOD FOR CONTROLLING A BATTERY SYSTEM

(71) Applicant: Vitesco Technologies GmbH, Regensburg (DE)

(72) Inventor: Ayman Ayad, Munich (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 789 days.

(21) Appl. No.: 17/978,387

(22) Filed: Nov. 1, 2022

(65) Prior Publication Data

US 2023/0133126 A1    May 4, 2023

(30) Foreign Application Priority Data

Nov. 2, 2021    (EP) ..................................... 21205841

(51) Int. Cl.
| | |
|---|---|
| *H02J 7/00* | (2006.01) |
| *B60L 58/12* | (2019.01) |
| *B60L 58/22* | (2019.01) |
| *G01R 31/374* | (2019.01) |
| *G01R 31/3835* | (2019.01) |
| *G01R 31/396* | (2019.01) |

(52) U.S. Cl.
CPC ............ *G01R 31/396* (2019.01); *B60L 58/12* (2019.02); *B60L 58/22* (2019.02); *G01R 31/374* (2019.01); *G01R 31/3835* (2019.01); *H02J 7/0014* (2013.01); *H02J 7/0047* (2013.01); *H02J 2207/20* (2020.01)

(58) Field of Classification Search
CPC ...... G01R 31/396; B60L 58/22; H02J 7/0014; H02J 7/0047
See application file for complete search history.

(56) References Cited

U.S. PATENT DOCUMENTS

| | | |
|---|---|---|
| 9,048,513 B2 | 6/2015 | Butzmann et al. |
| 9,065,154 B2 | 6/2015 | Butzmann |
| 9,559,528 B2 | 1/2017 | Kim et al. |
| 10,814,743 B2 | 10/2020 | Li et al. |

(Continued)

FOREIGN PATENT DOCUMENTS

| | | |
|---|---|---|
| DE | 102009027833 A1 | 1/2011 |
| DE | 102009027835 A1 | 1/2011 |

(Continued)

OTHER PUBLICATIONS

Walker, G.R., et al., "Cascaded DC-DC Converter Connection of Photovoltaic Modules", IEEE Transactions on Power Electronics, Jul. 2004, vol. 19(4), pp. 1130-1139.

(Continued)

*Primary Examiner* — Robert Grant

(74) *Attorney, Agent, or Firm* — Buchanan Ingersoll & Rooney PC

(57) ABSTRACT

A battery system including a number of first battery modules each including a number of battery cells, and a number of second battery modules each including a number of battery cells. Each second battery module includes a power electronics unit having a DC/DC converter. The first and second battery modules are connected in series. The first battery modules are connected directly in series and the second battery modules are connected via their power electronics units.

10 Claims, 2 Drawing Sheets

(56) References Cited

U.S. PATENT DOCUMENTS

| | | | |
|---|---|---|---|
| 2008/0042493 | A1 | 2/2008 | Jacobs |
| 2016/0118830 | A1 | 4/2016 | Jeon et al. |
| 2019/0225092 | A1 | 7/2019 | Li et al. |
| 2020/0176994 | A1* | 6/2020 | Hinterberger ......... H02J 7/0013 |
| 2021/0320505 | A1 | 10/2021 | Kunimitsu et al. |

FOREIGN PATENT DOCUMENTS

| | | | |
|---|---|---|---|
| JP | 2008193757 | A | 8/2008 |
| JP | 2014226031 | A | 12/2014 |
| JP | 2015213384 | A | 11/2015 |
| JP | 2016123193 | A | 7/2016 |
| JP | 2019110712 | A | 7/2019 |
| WO | 2008/121982 | A1 | 10/2008 |
| WO | 2020/022344 | A1 | 1/2020 |

OTHER PUBLICATIONS

Extended European Search Report for European Application No. 21205841.6, dated May 4, 2022, 5 pages.

Office Action (Notice to Submit Response) issued Sep. 12, 2024, by the Korean Intellectual Property Office in corresponding Korean Patent Application No. 10-2022-0140695 and an English translation of the Office Action. (11 pages).

English Translation of the Japanese Notification of Reasons for Refusal for Japanese Application No. 2022-175312, dated Nov. 27, 2023, 4 pages.

Office Action (First Office Action) issued Jul. 31, 2025, by the National Intellectual Property Administration, P. R. China in corresponding Chinese Patent Application No. 202211360694.0 and an English translation of the Office Action. (19 pages).

* cited by examiner

BATTERY SYSTEM AND METHOD FOR CONTROLLING A BATTERY SYSTEM

CROSS REFERENCE TO RELATED APPLICATIONS

This application claims priority to European Patent Application No. 21205841, filed Nov. 2, 2021, the contents of such application being incorporated by reference herein.

FIELD OF THE INVENTION

The present invention relates to a battery system, for example, for a hybrid vehicle or a fully electric vehicle. Furthermore, it relates to a method for controlling such a battery system.

BACKGROUND OF THE INVENTION

The high voltage battery pack of a battery electric vehicle or a plug-in hybrid electric vehicle is typically built by grouping battery cells in parallel and in series to compose battery cell modules. These modules are then connected in series to provide the required high-voltage on the DC link of the battery pack.

For this kind of battery pack, the temperatures and voltages of each cell are monitored using a cell supervision circuit for each module and the data is sent to the battery management controller. The battery management controller determines a state of charge and a state of health for each cell. According to the determined state of charge and state of health, the battery management controller sends control signals to the cell balancers which can balance the voltage of the cells according to known methods.

The cells imbalance results from the fact that the cells are different in terms of capacity, internal resistance, chemical degradation, and intercell temperature. The self-balancing is crucial to prevent cell overcharging and discharging, which would result in a decrease of the total storage capacity and lifetime. Furthermore, the imbalance can result in overvoltage which can destroy the cell and cause serious damage.

Another problem of cell imbalance is that it might cause incomplete charging of the battery and therefore lead to decreased capacity and incomplete usage of battery energy. There are active and passive balancing techniques which are either relatively cheap but slow or relatively fast but expensive.

Other approaches have been made to achieve a more efficient charging and discharging of a battery in an electric vehicle. In particular, a DCDC converter has been assigned to each battery module in order to control the output voltage of each module. Such a battery system is for example disclosed in DE 10 2000 902 7833 A1 and in US 2008/004 2493 A1, each incorporated herein by reference. The systems allow a very flexible charging and discharging of individual battery modules, but are relatively complex and require a high number of power components which produce considerable heat when operating.

SUMMARY OF THE INVENTION

Therefore, an aspect of the present invention, is a battery system which has an improved lifetime and capacity, is secure and easy to operate.

According to an aspect of the invention, a battery system is provided comprising a number of first battery modules each comprising a number of battery cells, and a number of second battery modules each comprising a number of battery cells, wherein each second battery module comprises a power electronics unit having a DCDC converter. The first and second battery modules are connected in series, wherein the first battery modules are connected directly in series and the second battery modules are connected via their power electronics unit.

The expression "a number of battery modules/battery cells" is here used to indicate "at least one battery module/battery cell".

For example, the battery system is for an electric vehicle, in particular, for a hybrid vehicle or a fully electric vehicle. Alternatively, the battery system may also be part of a stationary power storage. For instance, the battery system may be for a photovoltaic system.

According to an aspect of the invention, some battery modules of the battery system comprise a power electronics unit having a DCDC converter. The DCDC converters each have two input terminals and two output terminals, the input terminals being connected to the battery cells of the respective module and the output terminals being connected in series to the next, i.e. the subsequent and the preceding, battery modules. Thus, the second battery modules are connected in series via their power electronics unit. In contrast, the first battery modules do not comprise such a power electronics unit, but are connected directly in series to the next battery modules.

This battery system has the advantage, that the first battery modules are built up very simple, wherein the second battery modules can be charged and discharged very flexibly. In particular, the current drawn from each of the second battery modules can be optimised to ensure an even load of the battery modules.

Furthermore, it is possible to charge the battery either from a 400V or 800V charging station.

Because of the DCDC converters on the second modules, the voltage can be boosted on the DC-link side to a higher value.

Different kinds of battery cells may be used in the battery system, in particular new battery cells as well as battery cells which have already been in use. This has the advantage, that battery modules can be chosen according to need, and would improve and facilitate recycling of battery cells and battery modules.

According to an embodiment of the invention, the first battery modules are comprised of (or primarily, mainly comprise or only comprise) high-energy cells and the second battery modules are comprised of (or primarily, mainly comprise or only comprise) high-power cells.

High-power cells are battery cells which are used in applications focusing more on power than on range or on runtime. Today, high-power cells can for example have lithium titanate oxide anodes in combination with a nickel manganese cobalt oxide cathode, or lithium iron phosphate cathodes in combination with a graphite anode. High-energy cells, on the other hand, can for example have silicon-doped graphite anodes and transition metal cathodes. High-energy cells typically comprise a higher amount of energetically active material and have a higher capacity. In general, high-energy cells are optimised for high energy density and high-power cells for high power density.

Both types of cells can be used, for example, in an electric vehicle advantageously, but a combination of high-energy cells with high-power cells, where the high-power cells are grouped into battery modules which can be connected and disconnected from the traction unit, are particularly advantageous. According to this embodiment, the first battery modules comprising the high-energy cells are used for supplying energy to the electric vehicle in a basic mode, for example a low-performance drive in the city, while the second battery modules comprised of (or primarily, mainly comprise or only comprise) high-power cells may be connected additionally in situations, where high performance is needed, e.g. when driving on a highway and/or accelerating strongly.

The DCDC converters are preferably operable in buck mode, boost mode, path-through mode, bypass mode and/or off-mode. Preferably, all DCDC converters of the power electronics units assigned to the second battery modules are operable in these modes. Accordingly, the DCDC converters can be used to flexibly adjust the output voltage of each second battery module. Furthermore, each second battery module can be bypassed so that no energy is drawn from its battery cells.

According to an embodiment, the power electronics units comprise means to switch their respective module to a bypass mode, in which the module is not connected in series to other modules. These means to switch the module to a bypass mode may in particular be the power electronics unit comprising at least one DCDC converter and its respective controller, particularly the battery management system.

According to an embodiment of the invention, the battery system further comprises a smart battery management system for controlling the power electronics units, wherein the smart battery management system comprises means for determining a state of charge and/or a temperature and/or a voltage drop across the modules and means for determining the optimum output voltage for each DCDC converter and means for controlling the power electronics units by switching the DCDC converter in order to set the output voltage to the determined optimum output voltage.

According to an embodiment of the invention, each first battery module comprises a supervision circuit for battery balancing. This ensures that the cells of the first battery modules which do not comprise a power electronics unit with the DCDC converter are balanced during charging and discharging. Advantageously, the second battery modules also comprise a supervision circuit for battery balancing, where balancing is only performed on the module level, not between cells of different second modules.

According to an aspect of the invention, an electric vehicle is provided with the described battery system. The electric vehicle may for example be a battery electric vehicle or a plug-in hybrid electric vehicle.

According to another aspect of the invention, a method for controlling a described battery system is provided. The method comprises determining a state of charge and/or temperature and/or voltage drop across the modules and determining an optimum output voltage for each DCDC converter and controlling the power electronics units by switching the DCDC converters in order to set the output voltage to the determined optimum output voltage.

The method has the advantages already described in connection with the battery system.

According to an embodiment, if the determined optimum output voltage for a battery module is 0 V, the power electronics unit is controlled by switching the DCDC converter into a bypass mode.

According to an embodiment, all cells of a first battery module are (will be) balanced among each other and among the cells of other first battery modules, while the cells of a second battery module are only (will only be) balanced among each other.

Balancing of battery cells is performed to achieve an even load on the cells of a module and/or a battery. To balance cells, the temperature and voltage of each cell is determined and a state of charge of each cell is calculated. To balance the states of charge, cells with a higher voltage can be discharged over small loads until an even state of charge is reached.

According to this embodiment, cells of a first battery module are balanced in a conventional way among each other and among the cells of other first battery modules. However, cells of a second battery module are only balanced among each other, because the second battery modules are decoupled from each other by way of the power electronics units.

The battery system and the method have the advantage, that each group of battery cells can be individually controlled and even bypassed. This results in a high utilization of battery cells. The lifetime of battery cells can be increased by up to 30% and the overall system efficiency will be increased due to a wide range of available DC link voltage.

Furthermore, different kinds and/or brands of cells can be used together to construct the battery without limitations and the battery can be charged from any DC voltage up to 800 V.

BRIEF DESCRIPTION OF THE DRAWINGS

Embodiments of the present invention are described with reference to schematic figures.

DETAILED DESCRIPTION OF THE PREFERRED EMBODIMENTS

Figure 1:
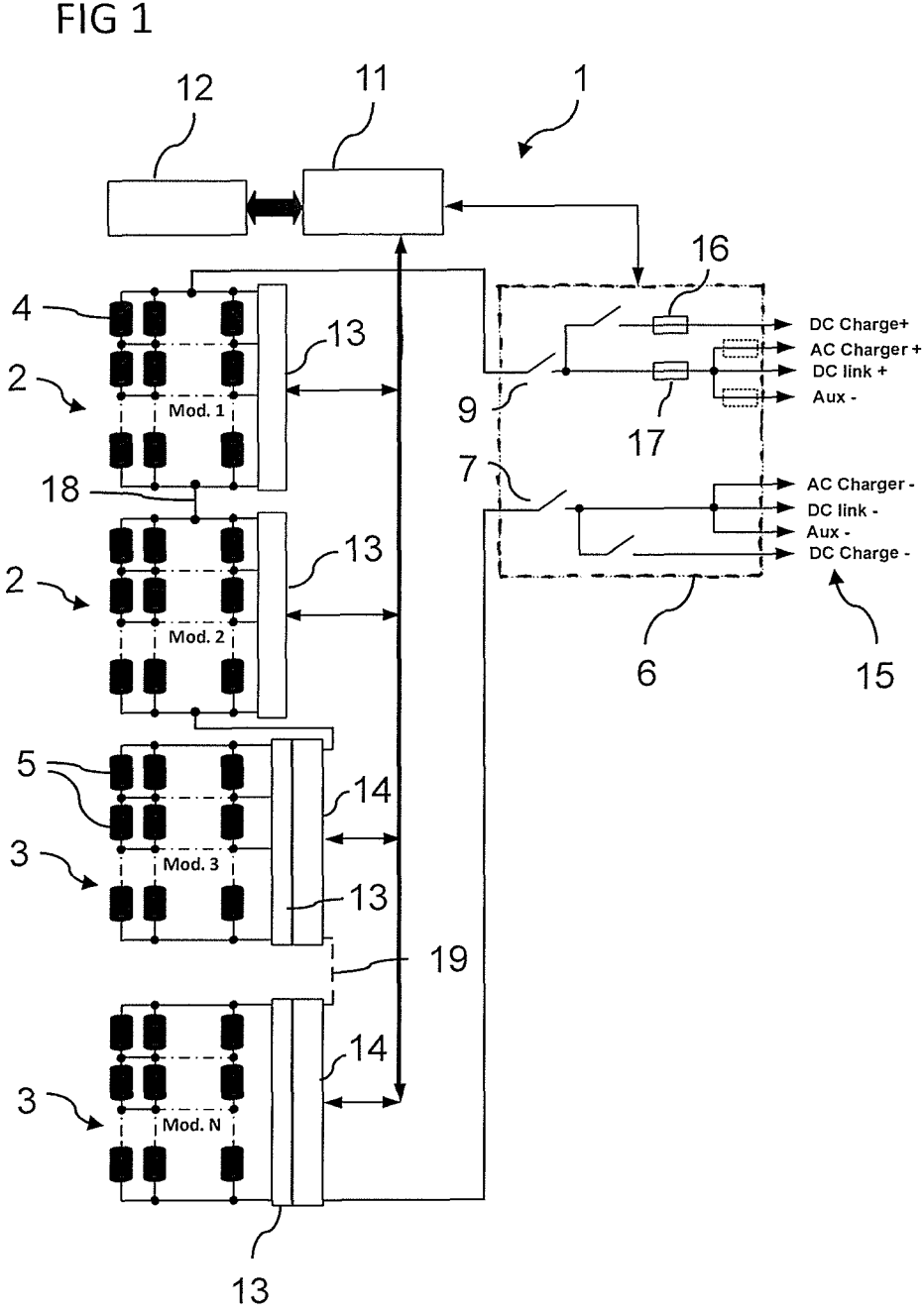
FIG. 1 shows a battery system according to an embodiment of the present invention and FIG. 2 shows a part of the battery system according to FIG. 1.

FIG. 1 shows a battery system 1. The battery system 1 comprises a number of first battery modules 2 and a number of second battery modules 3. In the embodiment shown in FIG. 1, there are only two first battery modules 2 and a number N of second battery modules 3. However, a smaller or larger number of first battery modules 2 may be provided in alternative embodiments.

In the following the battery system is disclosed as a battery system for an electric vehicle. It is noted, that the battery system can also be used for stationary power storage. For instance, the battery system may be used for a photovoltaic system.

The battery modules 2, 3 are connected in series to provide the DC link voltage between the main contactors 7, 9 of the battery system 1.

The first battery modules 2 are comprised of battery cells 4, which are connected in series and parallel to form a first battery module 2. Furthermore, each first battery module 2 has a cell supervision circuit 13 which supervises cell voltage and cell temperatures. The cell supervision circuit 13 communicates with a battery management system 11 of the battery system 1 to transmit voltage and temperature measurements to the battery management system 11.

The second battery modules 3 are also comprised of battery cells 5 connected to each other in series and parallel. The second battery modules 3 also comprise a cell supervisor circuit 13 for the supervision of cell voltage and temperature. In addition, the second battery modules 3 each comprise a power electronics unit 14 having a DCDC converter.

The first battery modules 2 may comprise a different kind of battery cells 4 as the second battery modules 3. In particular, the battery cells 4 may be high-energy cells while the battery cells 5 may be high-power cells.

The DCDC converters can be used to set the output voltage of the respective second battery module 3 to a predetermined value. To achieve this, the DCDC converters of the power electronics units 14 are operable in buck mode, boost mode and preferably also in the path-through mode and in a bypass mode.

The first battery modules 1 are directly connected to each other in series, which is indicated by the connection 18. The second battery modules 3 are in contrast connected to each other in series via their power electronics units 14, which is indicated by the connection 19.

In operation of the electric vehicle, i.e. while charging or while drawing current from the battery, the battery management system 11 which communicates with a vehicle control unit 12 receives all voltage measurements and temperature measurements from the first battery modules 2 and the second battery modules 3 and then estimates the state of charge of each cell and the average state of charge for each module 2, 3. For a certain requested DC link voltage from the vehicle control unit 12, the battery management system 11 decides which second battery modules 3 should contribute to the DC link voltage and therefore be connected to the first battery modules 2. The reference voltage for the DCDC converters for each of these modules 3 is calculated. The DCDC converters of the second battery modules 3 are controlled accordingly to deliver the desired output voltage or to bypass the certain second battery module 3.

Thus, the power electronics units 14 comprising the DCDC converters decouple the second battery modules 3 from each other and from the first battery modules 2.

From the voltage and temperature measurements, the battery management system 11 can calculate the differences in state of charge between first battery modules 2 and the difference in state of charge between each of the second battery modules 3. Consequentially, the battery management system 11 can control the cell supervisor circuits 13 to balance the battery cells 4 of the first battery modules 2, which are dependent on each other. The cells 5 of the second battery modules 3 need to be balanced only on the module level as the second battery modules 3 are decoupled from each other by the power electronics units 14.

The battery system 1 further comprises a battery junction box 6 comprising two main contactors 7 and 9 for connection to the battery modules 2, 3. The battery junction box 6 further comprises a DC charge fuse 16 and a main fuse 17 as well as terminals 15 for DC charge +, AC charger +, DC link +, AC charger −, DC link − and DC charge −.

Usually, the battery management system 11 is arranged inside a housing of the battery junction box 6. It may also be arranged outside the battery junction box 6.

Figure 2:
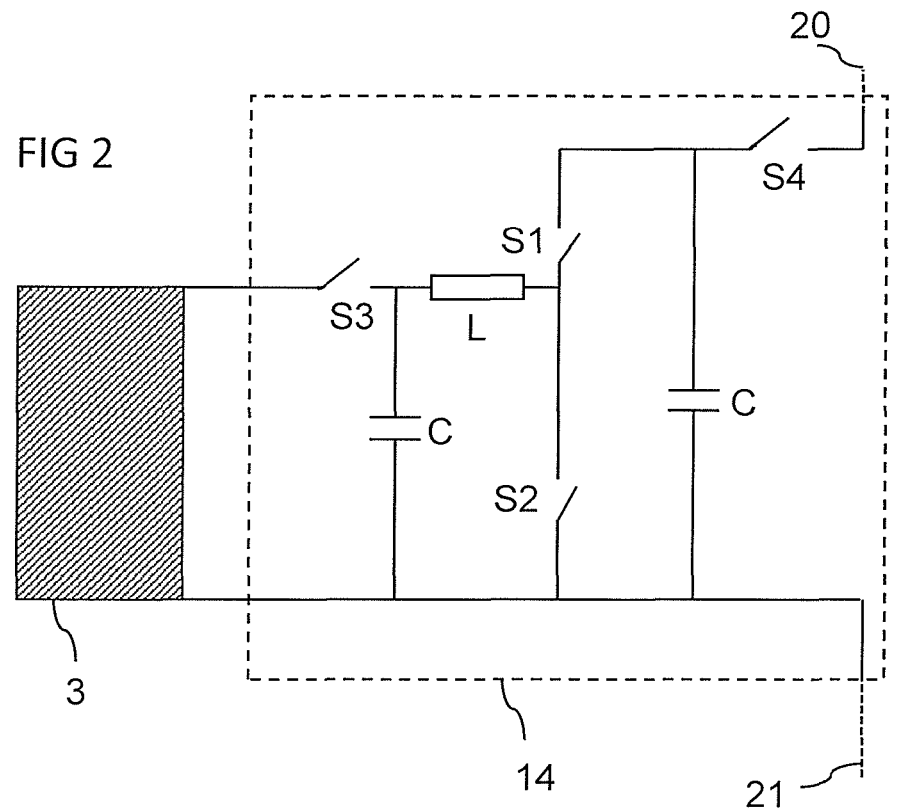

FIG. 2 shows one second battery module 3 of the battery system 1 according to FIG. 1 and its power electronics unit 14. The cell supervision circuit is not shown in FIG. 2. According to this embodiment, the power electronics unit 14 comprises a DCDC converter and additional switches to control different modes of operation of the power electronics unit 14. In a buck/boost mode, switch S3 and S4 are on and switches S1 and S2 are switching. In the buck/boost mode, the voltage drop between terminals 20 and 21 can be set to a predetermined voltage according to a state of charge of the second battery module 3 and according to a demand from the vehicle control unit 12.

In a bypass mode, switches S1, S2 and S4 are on and switch 3 is off, so that the second battery module 3 is bypassed. This mode can be chosen, when a certain second battery module 3 is not required to contribute to the operation of the electric vehicle or when a certain second battery module 3 is defective.

In a path-through mode, switches S1, S3 and S4 are on and switch 2 is off. In this mode, the second battery module 3 is operated in a conventional mode as the first battery modules 2 without adjusting the output voltage.

Furthermore, the power electronics unit 14 can be operated in a standby mode, where switches S1 and S2 are off and switches S3 and S4 are on, and in an open circuit mode, in which all switches are off and no high voltage is present.

The switches S1, S2, S3 and S4 are controlled by the battery management system 11.

The invention claimed is:

1. A battery system, comprising:
a number of first battery modules each comprising a number of battery cells; and
a number of second battery modules each comprising a number of battery cells, wherein each second battery module comprises a power electronics unit having a DCDC converter,
wherein one of the first battery modules is connected in series with one of the second battery modules, and
wherein the first battery modules are connected directly in series with one another and the second battery modules are connected to one another via their respective power electronics units.

2. The battery system according to claim 1, wherein the first battery modules are comprised of high-energy cells and the second battery modules are comprised of high-power cells.

3. The Battery system according to claim 1, wherein the DCDC converters are operable in a buck mode, a boost mode, a path-through mode, a bypass mode and/or an off-mode.

4. The battery system according to claim 1, wherein the power electronics units comprise means to switch their respective module to a bypass mode, in which the module is not connected in series to other modules.

5. The battery system according to claim 1, further comprising a smart battery management system for controlling the power electronics units, the smart battery management system comprising
means for determining a state of charge and/or a temperature and/or a voltage drop across the modules;
means for determining an optimum output voltage for each DCDC converter; and
means for controlling the power electronics units by switching the DCDC converter in order to set its output voltage to the determined optimum output voltage.

6. The battery system according to claim 1, wherein each first battery module comprises a cell supervision circuit for battery balancing.

7. An electric vehicle with a battery system according to claim 1.

8. A method for controlling a battery system according to claim 1, comprising:
determining a state of charge and/or a temperature and/or a voltage drop across the module;
determining an optimum output voltage for each DCDC converter; and
controlling the power electronics units by switching the DCDC converter in order to set its output voltage to the determined optimum output voltage.

9. The method according to claim 8, further comprising:

if the determined optimum output voltage for a battery module is 0V, controlling the respective power electronics unit by switching the DCDC converter into a bypass mode.

10. The method according to claim 8, wherein all cells of a first battery module are balanced among each other and among the cells of other first battery modules, while the cells of a second battery module are only balanced among each other.

* * * * *